United States Patent [19]

Wang

[11] Patent Number: 5,418,390
[45] Date of Patent: May 23, 1995

[54] SINGLE POLYSILICON LAYER E²PROM CELL

[75] Inventor: Patrick C. Wang, Cupertino, Calif.

[73] Assignee: Lattice Semiconductor Corporation, Hillsboro, Oreg.

[21] Appl. No.: 33,934

[22] Filed: Mar. 19, 1993

[51] Int. Cl.⁶ .................. H01L 27/115; H01L 27/088; H01L 29/788

[52] U.S. Cl. .................... 257/321; 257/322; 257/318; 257/315; 365/185

[58] Field of Search ............... 257/318, 321, 315, 322; 365/185

[56] References Cited

U.S. PATENT DOCUMENTS

| | | | |
|---|---|---|---|
| 3,952,325 | 4/1976 | Beal et al. | 357/23 |
| 4,019,197 | 4/1977 | Lohstroh | 257/318 |
| 4,425,631 | 1/1984 | Adam | 257/318 |
| 4,924,278 | 5/1990 | Logie | 357/23.5 |
| 5,019,879 | 5/1991 | Chin | 257/321 |
| 5,023,680 | 6/1991 | Gill et al. | 257/321 |

FOREIGN PATENT DOCUMENTS

| | | | |
|---|---|---|---|
| 60-37778 | 2/1985 | Japan | 257/321 |

OTHER PUBLICATIONS

Kume et al., "A 1.28μm² Contactless Memory Cell Technology for a 3V-Only 64Mbit EEPROM," IEDM 92-991—993 1992.

Primary Examiner—Jerome Jackson
Attorney, Agent, or Firm—Skjerven, Morrill, MacPherson, Franklin & Friel

[57] ABSTRACT

An E²PROM cell includes a substrate of one conductivity type having source and drain regions of an opposite conductivity type disposed along a surface thereof, with a channel region between the source and drain. An oxide layer is formed over the channel region and includes a relatively thick portion over the channel region, and first and second relatively thin portion over respective portions of the source and drain. Programming of the cell is achieved by electrons passing from the floating gate of the device through the thin oxide portion over the source, while erasing of the cell is undertaken by electrons passing from the drain through the thin oxide portion there over into the floating gate. The cell contains only a single layer of polysilicon, which forms the floating gate.

5 Claims, 3 Drawing Sheets (a) Program (b) Erase

SINGLE POLYSILICON LAYER E²PROM CELL

BACKGROUND OF THE INVENTION

This invention relates to memory cells, and more particularly, to an E²PROM cell having only a single polysilicon-containing layer.

This application is related to U.S. patent application Ser. No. 07/901,351, filed Jun. 19, 1992, by Patrick C. Wang, entitled "SINGLE POLYSILICON LAYER FLASH E²PROM CELL," and U.S. patent application Ser. No. 07/901,357, filed Jun. 19, 1992, by Patrick C. Wang, entitled "FLASH E²PROM ARRAY" (both assigned to the assignee of this invention).

DESCRIPTION OF THE PRIOR ART

Reference is made to U.S. Pat. No. 4,924,278, entitled "EEPROM USING A MERGED SOURCE AND CONTROL GATE," invented by Stewart Logie, issued May 8, 1990. This patent includes in its background section a general discussion of the operation of E²PROM memory devices. In particular, in FIG. 1A thereof, cited as prior art, and reproduced here as FIG. 1, that patent discusses the typical programming and erasing of a cell of the type shown in FIG. 1 herein. As shown and described therein, a typical prior art E²PROM memory cell includes transistor 100 having source 101 and drain 102 formed in silicon substrate 99, source 101 and drain 102 being of a conductivity type opposite to that of substrate 99, and having channel region 103 formed therebetween. Gate insulation 104 electrically insulates polycrystalline silicon floating gate 105 from channel 103 and drain 102. A very thin tunnel oxide region 106 electrically insulates a small portion of the floating gate 105 from drain 102, with the region 104A (connecting the thick and thin oxide regions 104B, 106) being laterally spaced a relatively great distance from the edge 102A of the drain 102 adjacent the channel region 103.

Programming and erasing of this cell are accomplished by Fowler-Nordheim tunnelling of electrons, as described in that patent.

The placement of the thin oxide region 106 as relatively remote from the channel region 103 results in the device being larger than would be desirable, it being understood that high packing density of cells in a semiconductor device is desirable.

Reference is also made to the paper "A 1.28 μm² Contactless Memory Cell Technology for a 3 V-Only 64 Mbit EEPROM," by Kume et al., published Dec. 13, 1992. That paper teaches programming and erasing of a particularly configured cell as shown in FIG. 2 herein, through Fowler-Nordheim tunnelling of electrons. As described in that paper, the memory cell of FIG. 2 is programmed through the drain by tunnel ejection of electrons from the floating gate, and is erased by tunnel ejection from the entire channel region to the floating gate.

It has been found that with this approach, over a relatively short period of time, the oxide through which the electrons must pass to and from the floating gate becomes damaged. In addition, this oxide layer traps a substantial number of electrons after relatively few programming and erasing cycles. These shortcomings make the device more difficult to program as time goes on, so that the endurance of such a device must be considered low. Additionally, both the '298 patent and the Kume et al. paper disclose devices which include more than one layer of polysilicon. Such device have been found difficult to manufacture and sensitive to slight variations in the manufacturing process.

SUMMARY OF THE INVENTION

The present memory cell for particular use as a E²PROM cell avoids the problem of having electrons pass from the entire channel region through the oxide layer into the floating gate during programming or erasing of the cell, with the attendant trapping of electrons in and damage to the oxide layer attendant thereto. Meanwhile the cell is very small in configuration so as to allow one to achieve a very high packing density of cells. Additionally, the present device includes only a single layer of polysilicon, resulting in a simple manufacturing process.

These features are achieved by providing that the gate oxide of the device has a relatively thick portion over the channel region and relatively thin portions over portions of the source and drain regions, the connecting portions between the thick portion and thin portions being generally aligned with the inner edges of the source and drain regions respectively adjacent the channel region. Additionally, the device includes only a single layer of polysilicon.

DESCRIPTION OF THE PREFERRED EMBODIMENT

Figure 1:
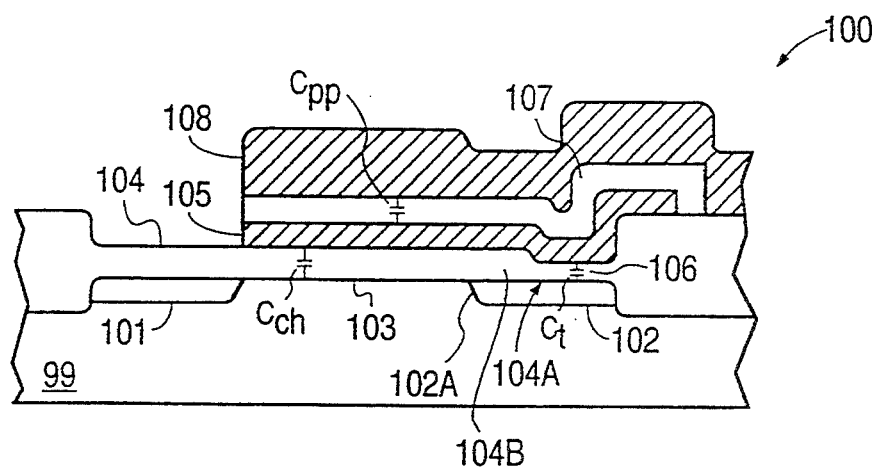
FIG. 1 is a cross-sectional view of a prior art E²PROM memory cell.
Figure 2A:
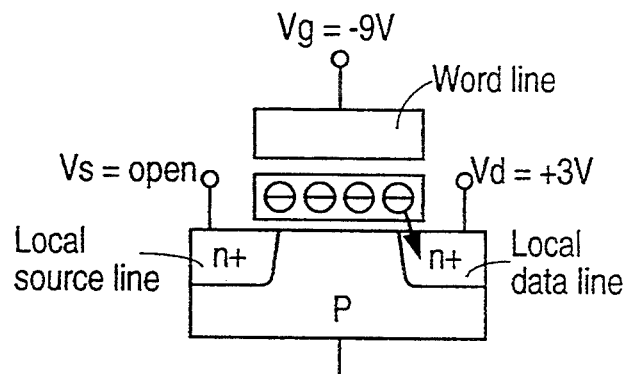
FIGS. 2(a) and 2(b) include sectional views of another E²PROM memory cell.
Figure 2B:
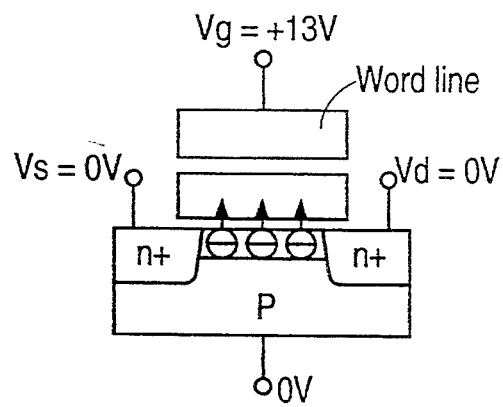
Figure 3:
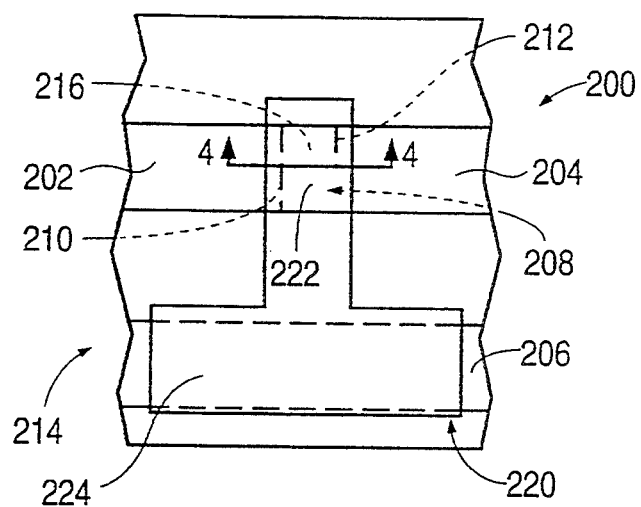
FIG. 3 is a view of an E²PROM cell in accordance with the present invention.
Figure 4:
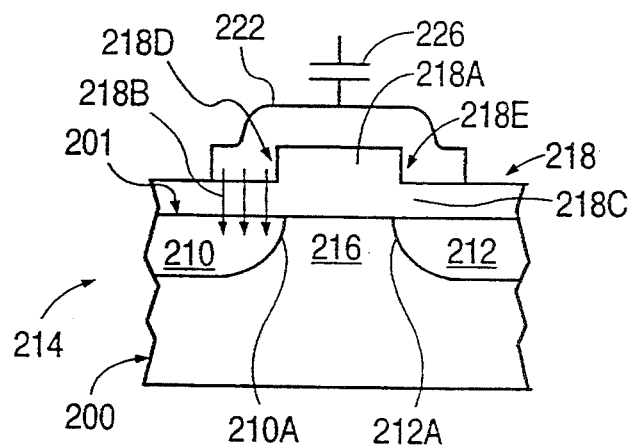
FIG. 4 is a sectional view taken along the line 4—4 of FIG. 3, showing programming of the cell.

As shown in FIG. 3, a P type substrate 200 has along its surface 201 elongated N regions 202, 204 formed therein, and elongated N region 206 formed therein, with the N regions 202, 204 being separated by a P region 208. The N regions 202, 204 define the source 210 and drain 212 respectively of an E²PROM cell 214, while the P region 208 forms the channel region 216 thereof. An oxide layer 218 (removed from FIG. 3 for clarity, but a portion of which is shown in FIG. 4) is disposed over the channel region 216 (FIG. 4), in fact having a relatively thick portion 218A overlying the channel region 216, a first relatively thin portion 218B connected to the thick portion 218A and overlying a portion of the source region 210, and a second relatively thin portion 218C connected to the thick portion 218A and overlying a portion of the drain region 212. The portion 218D of the oxide layer 210 which provides the transition between the thin oxide portion 218B and the thick oxide portion 218A (forming a step) is generally aligned with the edge 210A of the source region 210 adjacent the channel region 216, while the portion 218E of the oxide layer 218 which provides the transition between the thick oxide region 218A and the thin oxide portion 218C (forming a step) is generally aligned with the edge 212A of the drain region 212 adjacent the channel region 216.

It will be understood that the term "generally aligned" is used herein to encompass a degree of misalignment which might be involved due to the diffusion of the source and drain regions 210, 212 somewhat under the oxide layer 218, and also to include that situation where the transition portions 218D, 218E of the oxide layer 218 shift somewhat as the oxide layer 218 of FIG. 4 is completed.

A polysilicon layer 220 includes as a part thereof the floating gate 222 of the device 214, disposed on oxide layer 218.

The portion 222 of the polysilicon layer 220 connects up with the portion 224 of the polysilicon layer 220 overlying the N region 206. The polysilicon portions 222, 224 make up part of a single polysilicon layer 220 of the device 214.

The N region 206 at the surface 201 of the substrate is the control gate of the device 214, the polysilicon layer portion 224 and N region 206 (with oxide therebetween) forming a capacitor 226 as shown in FIG. 4, so that the polysilicon layer portion 222 acts as the floating gate of the device 214.

During programming of the cell, the control gate 206 is held at ground, while the source region 210 is supplied with, for example, +12 to 15 volts, while the drain region 212 is allowed to float. This will draw electrons from the floating gate 222 through the thin oxide region 218B, and into the source region 210, through Fowler-Nordheim tunnelling of the electrons through the oxide layer portion 218B.

Erasing of this cell 216 is accomplished by applying +12 to 15 volts to the control gate 206 while holding the drain 212 at ground and allowing the source 210 to float. Again, through Fowler-Nordheim tunnelling of the electrons, the electrons will travel from the drain region 204 through the thin oxide region 218C to the floating gate 222.

Figure 5:
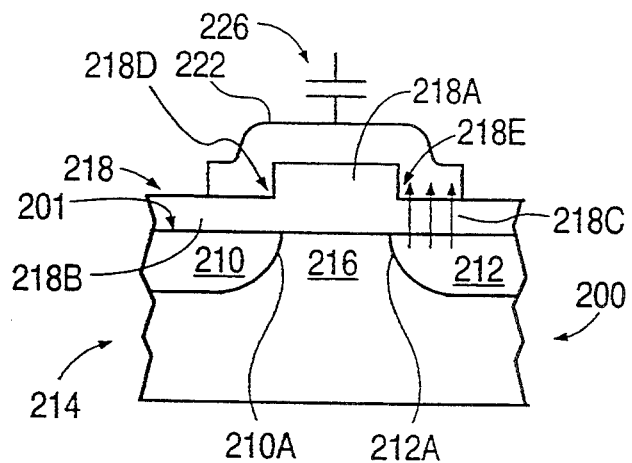
FIG. 5 is a view similar to that shown in FIG. 4, but showing erasing of the cell.
Figure 6:
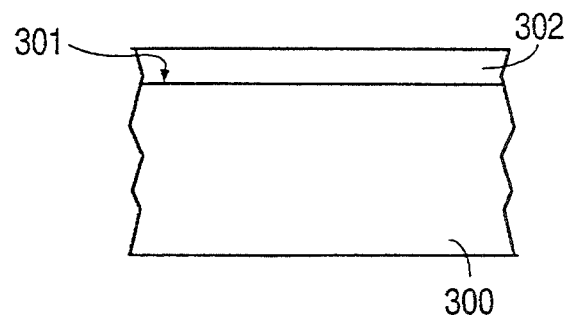
FIGS. 6–9 show a method of fabricating the device of FIGS. 3-5.
Figure 7:
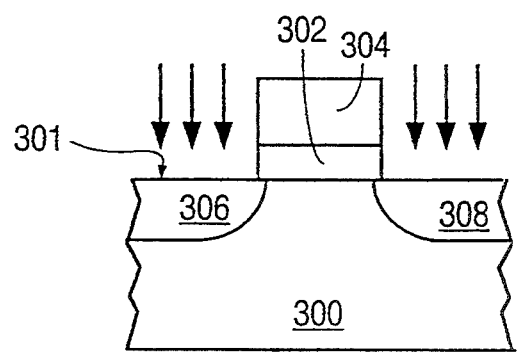
Figure 8:
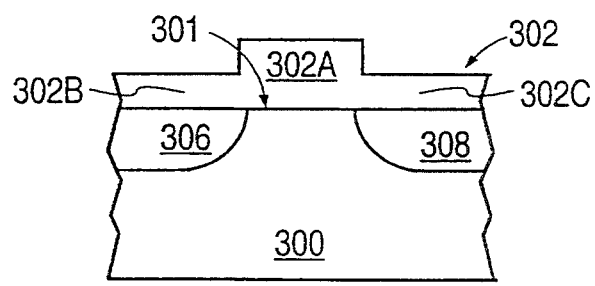
Figure 9:
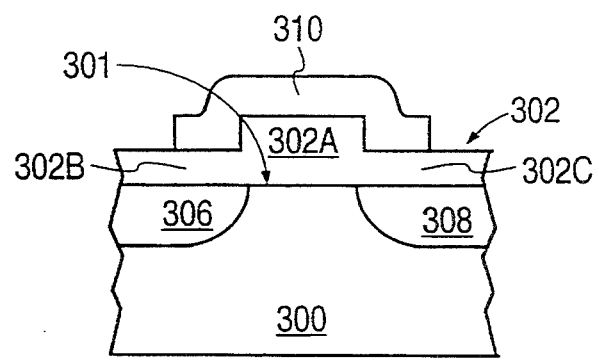

With reference to FIGS. 6–9, the device of FIGS. 3–5 may be formed, for example, by initially providing a P type substrate 300 and growing a layer of oxide 302 on surface 301 thereof. Photoresist 304 is provided on the layer of oxide 302, and then an etching step is undertaken to etch away the oxide 302 not covered by photoresist 304. An N type dopant is implanted into the resulting structure to form the source 306 and drain 308 in the substrate 300 (FIG. 7).

The photoresist 304 is then removed and the oxide 302 is then again grown so that the relatively thick oxide portion 302A is formed, as are relatively thin oxide portions 302B, 302C on either side thereof. Finally, the polysilicon floating gate 310 is formed and shaped over the oxide 302.

It is to be noted that because Fowler-Nordheim tunnelling of electrons is used, it is not necessary to generate hot electrons as would be necessary in a typical flash E²PROM cell. Thus, the very high currents necessary to generate such hot electrons are not necessary in the present invention, and it follows that a charge pump can be used herein to achieve voltages of the level of 12 to 15 volts based on only a 3 volt supply. Such a charge pump could not be used in the situation of hot electron generation, because of the very high currents involved.

Additionally, a flash E²PROM cell, wherein hot electrons are generated, typically has a boron implant in the channel region which is needed to achieve generation of hot electrons. Such a boron implant may be eliminated herein, and by elimination of the boron implant in the channel region, a lower threshold voltage can be achieved, and corresponding thereto, a higher gain of the device can be achieved. With a lower threshold voltage, a reliability improvement is also achieved.

With current demands being low, it is readily found that a 3 volt supply coupled to a charge pump to achieve voltages of 12 to 15 volts is sufficient for bulk erase of the cells.

It has been found that by avoiding having electrons pass from the entire channel region through the oxide layer and into the floating gate, and in fact having only the electrons pass through relatively thinner portions over the source or drain as described above, the problem of damage to the oxide layer or undesired retention of electrons therein is greatly reduced or eliminated.

Furthermore, as set forth above, with both of the cells described as background material including at least two layers of polysilicon, such devices have been found difficult to manufacture, and are sensitive to slight variations in the manufacturing process, which results in devices which do not function as desired or may not function at all. These problems are clearly overcome by the present invention which includes only a single layer of polysilicon.

I claim:

1. An E²PROM cell comprising:
   a substrate of a first conductivity type having source, drain and control regions of a second conductivity type disposed along a surface of the substrate and extending into the substrate;
   the source and drain regions of second conductivity type defining a channel region therebetween along the substrate surface, the control region being separated from the source and drain regions;
   a gate oxide formed over the channel region and over portions of the source region, the drain region and the control region of second conductivity type; and
   a floating gate formed over the gate oxide such that the floating gate extends from the source and drain regions to the control region, said floating gate being part of the only polysilicon layer of the cell;
   wherein the gate oxide includes a first, relatively thick portion overlying said channel region, a second, relatively thin portion overlying said portion of said source region of second conductivity type, and a third, relatively thin portion overlying said portion of said drain region of second conductivity type, the second and third thin portions having the same thickness; and
   wherein the portion of the gate oxide connecting the first and second portions thereof is generally aligned with the edge of the source region of second conductivity type adjacent the channel region, and the portion of the gate oxide connecting the first and third portions thereof is generally aligned with the edge of the drain region of second conductivity type adjacent the channel region.

2. The cell of claim 1 wherein the relatively thick portion, relatively thin portion and portion of the gate oxide connecting the first and second portions thereof together define a step.

3. An E²PROM cell of the type comprising:
   a substrate of a first conductivity type having source, drain and control regions of a second conductivity type disposed along a surface of the substrate and extending into the substrate, a channel region between the source and drain regions of second conductivity type, the source and drain regions being separated from the control region, an oxide layer formed over the source, drain and control regions of the second conductivity type, the oxide layer including a gate oxide portion formed over the channel region and a portion of the source region of second conductivity type, and a floating gate formed over the oxide layer such that the floating gate extends from the source and drain regions to the control region, the E²PROM cell being of the type:

wherein electrons flow from the floating gate through the gate oxide to one of the source and drain regions of second conductivity type during programming of the cell, wherein electrons flow from the other of the source and drain regions of second conductivity type through the gate oxide to the floating gate during erasing of the cell, and wherein the floating gate is part of the only polysilicon layer of the cell.

4. The cell of claim 3 wherein the gate oxide has a first, relatively thick portion overlying said channel region, and the second, relatively thin portion overlaying said portion of said source region of second conductivity type, the portion of the gate oxide connecting the first and second portions thereof being generally aligned with the edge of the source region of second conductivity type adjacent the channel region.

5. The cell of claim 3 wherein the gate oxide includes a third, relatively thin portion overlying a portion of the drain region of second conductivity type, a portion of the gate oxide connecting the first and third portions thereof being generally aligned with the edge of the drain region of second conductivity type adjacent the channel region.

* * * * *